(12) United States Patent
Hu et al.

(10) Patent No.: US 9,960,348 B2
(45) Date of Patent: May 1, 2018

(54) IN-SITU ANNEALING TO IMPROVE THE TUNNELING MAGNETO-RESISTANCE OF MAGNETIC TUNNEL JUNCTIONS

(71) Applicant: International Business Machines Corporation, Armonk, NY (US)

(72) Inventors: Guohan Hu, Yorktown Heights, NY (US); Daniel C. Worledge, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/183,421

(22) Filed: Jun. 15, 2016

(65) Prior Publication Data

US 2016/0301002 A1    Oct. 13, 2016

Related U.S. Application Data

(62) Division of application No. 14/585,435, filed on Dec. 30, 2014.

(51) Int. Cl.
| | |
|---|---|
| *H01L 43/12* | (2006.01) |
| *H01L 27/22* | (2006.01) |
| *H01L 43/08* | (2006.01) |
| *H01L 27/105* | (2006.01) |

(52) U.S. Cl.
CPC .......... *H01L 43/12* (2013.01); *H01L 27/1052* (2013.01); *H01L 27/222* (2013.01); *H01L 43/08* (2013.01); *H01L 27/228* (2013.01)

(58) Field of Classification Search
None
See application file for complete search history.

(56) References Cited

U.S. PATENT DOCUMENTS

| | | |
|---|---|---|
| 6,818,549 B2 | 11/2004 | Fricke et al. |
| 7,919,794 B2 | 4/2011 | Gu et al. |
| 8,828,743 B1 | 9/2014 | Debrosse et al. |

(Continued)

OTHER PUBLICATIONS

List of IBM Patents or Patent Applications Treated as Related; Date Filed: Jun. 15, 2016, pp. 1-2.

*Primary Examiner* — Michael Lebentritt
*Assistant Examiner* — Jordan Klein
(74) *Attorney, Agent, or Firm* — Cantor Colburn LLP; Vazken Alexanian

(57) ABSTRACT

Embodiments are directed to a magnetic tunnel junction (MTJ) memory cell that includes a reference layer formed from a perpendicular magnetic anisotropy (PMA) reference layer and an interfacial reference layer. The MTJ further includes a free layer and a tunnel barrier positioned between the interfacial reference layer and the free layer. The tunnel barrier is configured to enable electrons to tunnel through the tunnel barrier between the interfacial reference layer and the free layer. A first in-situ alignment is provided between a tunnel barrier lattice structure of the tunnel barrier and an interfacial reference layer lattice structure of the interfacial reference layer. A second in-situ alignment is provided between the tunnel barrier lattice structure of the tunnel barrier and a free layer lattice structure of the free layer. The PMA reference layer lattice structure is not aligned with the interfacial reference layer lattice structure.

13 Claims, 7 Drawing Sheets

(56) References Cited

U.S. PATENT DOCUMENTS

| | | |
|---|---|---|
| 8,835,256 B1 | 9/2014 | Debrosse et al. |
| 8,901,529 B2 | 12/2014 | Debrosse et al. |
| 9,373,783 B1 | 6/2016 | Debrosse et al. |
| 9,450,179 B2 | 9/2016 | Debrosse et al. |
| 9,472,754 B2 | 10/2016 | Hu et al. |
| 9,478,736 B2 | 10/2016 | Debrosse et al. |
| 2008/0164548 A1 | 7/2008 | Ranjan et al. |
| 2010/0020592 A1* | 1/2010 | Hosotani ............ G11C 11/16 365/158 |
| 2013/0078482 A1* | 3/2013 | Shukh ............... G11B 5/3909 428/811.1 |
| 2014/0015076 A1* | 1/2014 | Gan .................. H01L 43/08 257/421 |
| 2014/0248719 A1* | 9/2014 | Zhou ................. G11C 11/161 438/3 |
| 2015/0280112 A1 | 10/2015 | Li et al. |
| 2015/0303372 A1* | 10/2015 | Meade ............... H01L 43/08 257/421 |
| 2016/0190435 A1 | 6/2016 | Hu et al. |

* cited by examiner

US 9,960,348 B2

IN-SITU ANNEALING TO IMPROVE THE TUNNELING MAGNETO-RESISTANCE OF MAGNETIC TUNNEL JUNCTIONS

DOMESTIC PRIORITY

This application is a division of U.S. application Ser. No. 14/585,435, entitled "IN-SITU ANNEALING TO IMPROVE THE TUNNELING MAGNETO-RESISTANCE OF MAGNETIC TUNNEL JUNCTIONS," filed Dec. 30, 2014, the disclosure of which is incorporated by reference herein in its entirety.

BACKGROUND

The present disclosure relates generally to electronic memory technology, and more specifically to the introduction of an in-situ annealing operation to improve the tunneling magneto-resistance (TMR) of magnetic tunnel junctions (MTJs).

Spin transfer torque magnetic random access memory (STT-MRAM) is an attractive emerging memory technology, offering non-volatility, high performance and high endurance. A typical STT-MRAM includes a multi-layered MTJ memory cell in series with a field effect transistor (FET), which is gated by a word line (WL). A bit line (BL) and a source line (SL) run parallel to each other and perpendicular to the WL. The BL is connected to the MTJ, and the SL is connected to the FET. One MTJ memory cell along the BL is selected by turning on its WL. When a voltage (e.g., 500 mV) is forced across the cell from BL to SL, the selected cell's MTJ is written into a particular state, which is determined by the polarity of this voltage (BL high vs. SL high).

Crystalline lattice structures can have special electrical properties that polycrystalline and amorphous lattice structures normally cannot. Forming a tunnel barrier layer of the MTJ from a crystalline material such as MgO results in a higher TMR. Providing a large TMR is desirable because a large TMR allows electrons to more easily tunnel from one ferromagnetic layer (e.g., an MTJ free layer) through the thin dielectric tunnel barrier into the other ferromagnetic layer (e.g., an MTJ fixed layer). Thus, a larger TMR results in a larger difference between the MTJ free layer resistance and the MTJ fixed layer resistance, thereby improving the ability to read the MTJ state (e.g., a "0" or a "1").

TMR may be driven even higher by extending the crystalline lattice structure of the MgO tunnel barrier into the ferromagnetic free layer and the ferromagnetic reference layer that are adjacent to the MgO tunnel barrier. More specifically, an even larger TMR is expected when the lattice structures of the MTJ ferromagnetic layers (e.g., the free layer and the reference layer) crystallize into the body-centered-cubic (bcc) (e.g., bcc (100)) texture and are lattice matched to that of the MgO tunnel barrier. Because MTJ ferromagnetic layers are amorphous in their as-grown state, a post-deposition annealing step is needed in order to crystallize the MTJ ferromagnetic layers that are adjacent to the MTJ tunnel barrier.

SUMMARY

Embodiments are directed to an MTJ memory cell that includes a reference layer formed from a PMA reference layer and an interfacial reference layer. The MTJ further includes a free layer and a tunnel barrier positioned between the interfacial reference layer and the free layer. The tunnel barrier is configured to enable electrons to tunnel through the tunnel barrier between the interfacial reference layer and the free layer. A first in-situ alignment is provided between a tunnel barrier lattice structure of the tunnel barrier and an interfacial reference layer lattice structure of the interfacial reference layer. A second in-situ alignment is provided between the tunnel barrier lattice structure of the tunnel barrier and a free layer lattice structure of the free layer. The PMA reference layer lattice structure is not aligned with the interfacial reference layer lattice structure.

Embodiments are further directed to a method of fabricating an MTJ memory cell. The method includes forming a free layer and a tunnel barrier. The method further includes forming a reference layer from a PMA reference layer and an interfacial reference layer. The tunnel barrier is positioned between the interfacial reference layer and the free layer and configured to enable electrons to tunnel through the tunnel barrier between the interfacial reference layer and the free layer. A first in-situ alignment is performed between a tunnel barrier lattice structure of the tunnel barrier and an interfacial reference layer lattice structure of the interfacial reference layer. A second in-situ alignment is performed between the tunnel barrier lattice structure and a free layer lattice structure of the free layer. The performing of the first in-situ alignment and the second in-situ alignment are before the forming of the PMA reference layer.

Additional features and advantages are realized through the techniques of the present disclosure. Other embodiments and aspects of the disclosure are described in detail herein and are considered a part of the claimed subject matter. For a better understanding, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The foregoing and other features and advantages are apparent from the following detailed description taken in conjunction with the accompanying drawings in which:

DETAILED DESCRIPTION

Figure 1A:
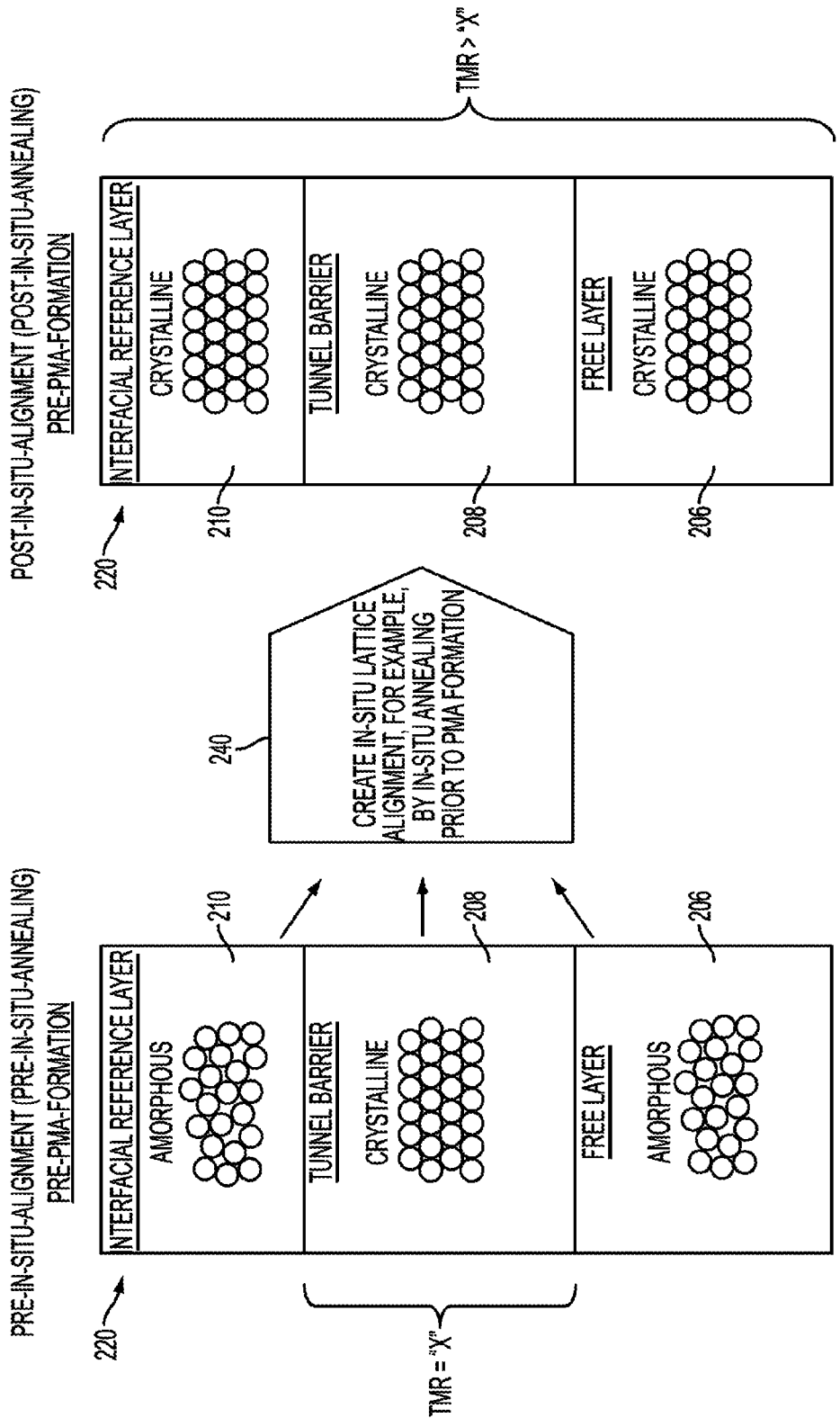
FIG. 1A depicts a conceptual diagram illustrating a methodology for fabricating an MTJ memory cell using an in-situ annealing step to improve the lattice match between free layer, the interfacial reference layer and the tunnel barrier, which results in high TMR in accordance with one or more embodiments.

Various embodiments of the present disclosure will now be described with reference to the related drawings. Alternate embodiments may be devised without departing from the scope of this disclosure. It is noted that various connections are set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

Additionally, it is noted that the disclosure of U.S. patent application Ser. No. 13/843,998 entitled "MEMORY ARRAY WITH SELF-ALIGNED EPITAXIALLY GROWN MEMORY ELEMENTS AND ANNULAR FET" filed Mar. 15, 2013, along with the disclosure of U.S. patent application Ser. No. 13/835,868 entitled "STRUCTURE AND FABRICATION OF MEMORY ARRAY WITH EXPITAXIALLY GROWN MEMORY ELEMENTS AND LINE-SPACE PATTERNS" filed Mar. 15, 2013, which are incorporated herein by reference, describe STT-MRAM cell structures in which hetero-epitaxial MTJ layers are deposited directly onto silicon wafer surfaces utilizing the wafer itself as the seed. Generally, sequential deposition of the MTJ layers in a hetero-epitaxial manner adjacent to a crustal surface forming an epitaxial seed improves the consistency of the electrical and magnetic properties of the MTJ cell. This allows the operational currents, cell size, film thicknesses and power consumption to be reduced while improving the performance characteristics of the MTJ cells.

Turning now to a more detailed description of background technology relevant to one or more disclosed embodiments, electronic memory may be classified as either volatile or non-volatile. Volatile memory requires constant power to retain stored data, while non-volatile memory does not. A common memory found in computers is volatile random access memory (RAM), which provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a transistor, a magnetic tunnel junction (MTJ) device for data storage, a bit line and a word line. In general, the MTJ's electrical resistance will be high or low based on the relative magnetic states of certain MTJ layers. Data is written to the MTJ by applying certain magnetic fields or charge currents to switch the magnetic states of the MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism.

STT-MRAM is a type of MRAM that uses electrons that have been spin-polarized to switch the magnetic state of the MTJ free layer. During the write operation, the spin-polarized electrons exert a torque on the free layer, which can switch the free layer magnetic state. STT-MRAM is an attractive emerging memory technology, offering non-volatility, high performance and high endurance. A typical STT-MRAM memory cell includes a magnetic tunnel junction (MTJ) in series with a field effect transistor (FET), which is gated by a word line (WL). A bit line (BL) and a source line (SL) run parallel to each other and perpendicular to the WL. The BL is connected to the MTJ, and the SL is connected to the FET. One memory cell along the BL is selected by turning on its WL. When a relatively large voltage (e.g., 500 mV) is forced across the cell from BL to SL, the selected cell's MTJ is written into a particular state, which is determined by the polarity of this voltage (BL high vs. SL high). When the cell is in a logic zero (0) or parallel state, its MTJ resistance is lower than when the cell is in a logic one (1) or anti-parallel state. A selected cell is read by sensing the resistance from BL to SL. The "sense" or "read" voltage must be much lower than the write voltage in order to clearly distinguish write and read operations, and to avoid inadvertently disturbing the cell during a read operation. Thus, sensing methodologies must be capable of accurately sensing very low read voltage (e.g., less than 50 mV).

Tunnel magnetoresistance (TMR) is an MTJ device characteristic that impacts the ability to control the micromagnetic behavior and, therefore, the switching behavior of STT-MRAM MTJs. The term "magnetoresistance" describes the effect whereby a change to certain magnetic states of the MTJ storage element results in a change to the MTJ resistance, hence the name "Magnetoresistive" RAM. A typical MTJ structure includes a stacked configuration having a fixed magnetic layer (e.g., Fe, CoFe, CoFeB, etc.) over a thin dielectric tunnel barrier (e.g., MgO) over a free magnetic layer (e.g., Fe, CoFe, CoFeB, etc.). A magnetic state (e.g., a magnetic moment or a polarity) of the free magnetic layer can be switched by current or by field, and a corresponding magnetic state of the fixed magnetic layer is relatively stable. The MTJ has a low resistance when the magnetic state of its free layer is parallel to the magnetic state of its fixed layer. Conversely, the MTJ has a high resistance when its free layer magnetic state is oriented anti-parallel to its fixed layer magnetic state. As noted above, STT-MRAM uses electrons that have been spin-polarized to switch the magnetic state of its MTJ free layer. During the write operation, the spin-polarized electrons exert a torque on the free layer, which can switch the free layer magnetic state. During the read operation, the MTJ's associated word line transistor is activated, which switches current from a bit line through the MTJ.

Continuing with a detailed description of relevant background technology, in general, materials may be characterized as crystalline, polycrystalline or amorphous. A crystal or crystalline solid is a solid material having constituent atoms, molecules or ions arranged in an ordered pattern extending in all three spatial dimensions. When the periodicity in the crystal structure is interrupted at so-called grain boundaries, the crystal is said to be polycrystalline. A polycrystalline solid is a solid material having constituent atoms, molecules or ions are arranged in many ordered patterns fused together into a single solid. An amorphous or non-crystalline solid is a solid material having constituent atoms, molecules or ions having no periodic structure whatsoever. Thus, amorphous solids lack the long-range order characteristic of a crystal.

As noted above, a crystal or crystalline solid is a solid material having constituent atoms, molecules or ions arranged in an ordered pattern extending in all three spatial dimensions. A crystalline solid's lattice structure is the regular array of points about which the atoms, ions or molecules composing the crystal are centered. In addition to their microscopic structure, large crystals are usually identifiable by their macroscopic geometrical shape, consisting of flat faces with specific, characteristic orientations. Small, 3-dimensional, repeating units called unit cells are responsible for the order found in crystalline solids. The unit cell can be thought of as a boxes, which, when stacked together in 3-dimensions, produce the crystal lattice. There are a limited number of unit cells that can be repeated in an orderly pattern in three dimensions. In the cubic crystal system three types of arrangements are found, namely, simple cubic, body-centered cubic and face-centered cubic. The process of crystal formation via mechanisms of crystal growth is known as crystallization or solidification. Miller indices are a convenient way to identify crystal planes and directions. For planes, the index is the reciprocal of the value of the intersection of the plane with a particular axis, converted to whole numbers. The designations h, k and l refer to principal axes x, y and z. Planes are indicated by parenthesis, e.g., (hkl). An example of a plane family, which represents all six faces of a cube, is (100), (010), (001), (−100), (0−10) and (00−1).

Crystalline lattice structures can have certain special electrical properties that polycrystalline and amorphous materials normally cannot. These properties are related to the anisotropy of the crystal, i.e. the lack of rotational symmetry in its atomic arrangement. One special property of crystalline materials is that they result in a relatively higher TMR in MTJ memory cell applications. Providing a large TMR is desirable because a large TMR allows electrons to more easily tunnel from one ferromagnetic layer (e.g., an MTJ free layer) through the thin dielectric tunnel barrier into the other ferromagnetic layer (e.g., an MTJ fixed layer). Thus, a larger TMR results in a larger difference between the MTJ free layer resistance and the MTJ fixed layer resistance, thereby improving the ability to read the MTJ state (e.g., a "0" or a "1").

Forming the MTJ tunnel barrier from a crystalline material such as MgO has a positive impact on TMR. TMR may be driven even higher by extending the crystalline structure of the MgO tunnel barrier into the ferromagnetic free layer and the ferromagnetic reference layer that surround the tunnel barrier. More specifically, an even larger TMR is expected only when the MTJ ferromagnetic layer crystallize into a bcc (100) texture on top of the fcc (100) tunnel barrier. Because MTJ ferromagnetic layers are amorphous in their as-grown state, a post-fabrication annealing step is needed in order to crystallize the MTJ ferromagnetic layers that surround the MTJ tunnel barrier. As used herein, the terms "post-fabrication" and/or "post-deposition refer to after all layers of the MTJ have been deposited.

However, post-fabrication annealing impacts other MTJ device characteristics that actually work to reduce TMR. For example, where the MTJ ferromagnetic layers are fabricated from CoFeB, CoFeB crystallization is very sensitive to the materials that are in direct contact with it, which, in a typical MTJ configuration are a PMA layer above and an MgO tunnel barrier layer below. MTJs composed of ferromagnetic layers with perpendicular magnetic anisotropy (PMA) provide reduced switching currents because the demagnetizing field is parallel to the magnetization of the MTJ layers. This is in contrast to in-plane MTJs, wherein the demagnetizing field is normal to the magnetization of the MTJ layers. Other PMA advantages for MTJ applications include good thermal stability and easy lithography, which allows for more densely spaced elements.

When a CoFeB interfacial layer is adjacent to a PMA layer with a hexagonal-close-packed (hcp) or face-centered-cubic (fcc) crystal structure, the CoFeB layer can crystallize into an fcc crystal structure or a bcc structure with mixed textures of (110) and (100). In either case, the TMR of the MgO tunnel barrier layer is degraded due to the lattice mismatch between the interfacial layer and MgO tunnel barrier. Because easily grown PMA materials that are most suitable for MTJ applications typically have either hcp crystal structure (for example CoCrPt) or fcc crystal structure (for example, Co/Pd, Co/Ni, Co/Pt multi-layers and CoPt L12 alloys), it is difficult to incorporate the most advantageous PMA materials into MTJ-based memory cells.

In addition, elements present in the PMA layer and the CoFeB interfacial layer tend diffuse into the MgO tunnel barrier layer during post-fabrication deposition annealing. Thus, the presence of elements with low spin polarization at the MgO interface, including Pd, Pt, Ni, Cr, Mn, Tb and the like, which are common in PMA materials, can also decrease the TMR significantly. Thus, it is critical to only have highly spin polarized material in the interfacial layer at the interface between the interfacial layer and the tunnel barrier layer.

Embodiments of the present disclosure are directed generally to electronic memory technology, and more specifically to providing an MTJ memory cell having in-situ alignment of the lattice structures of selected MTJ layers, thereby allowing the MTJ to operate with a relatively large TMR. Turning now to an overview of the disclosed embodiments, there is disclosed herein an MTJ memory cell, along with a method of fabricating the same, that provides improved and/or increased TMR by introducing an in-situ lattice alignment between the MTJ tunnel barrier and the surrounding MTJ interfacial reference layer and MTJ free layer. In-situ lattice alignment is accomplished according to the present disclosure by an in-situ annealing operation that occurs after the formation or deposition of the MgO tunnel barrier and the interfacial layer. As used in the present disclosure, the term "in-situ lattice alignment" means a lattice alignment that is confined to selected layers of the MTJ. Similarly, as used in the present disclosure, the term "in-situ annealing" means an annealing that is confined to selected layers of the MTJ. Another MTJ layer with stronger PMA is then formed or deposited on top of the interfacial layer at a lower temperature or at room temperature after the in-situ lattice alignment operation, which may be accomplished by the in-situ annealing operation. This significantly opens up the material choices for PMA MTJs.

As will be described in greater detail later in this disclosure, the MTJ free layer is underneath the MgO tunnel barrier and can be grown on various seed layers which do not diffuse significantly under 500° C., including Ta, TaN, Mo, MoN, W, MgO or other oxides. The MTJ reference layer may be formed from a high PMA reference layer on top of an interfacial reference layer, which interfaces with the MgO tunnel barrier. After the formation and/or deposition of the interfacial reference layer, the currently formed layers of the MTJ film stack are in-situ lattice aligned by an in-situ annealing operation. Preferably, the in-situ annealing temperature is sufficient to cause epitaxial crystal growth between the tunnel barrier lattice structure and the interfacial reference layer lattice structure. Preferably, the in-situ annealing temperature is further sufficient to cause epitaxial crystal growth between the tunnel barrier lattice structure and free layer lattice structure. In one or more embodiments, the in-situ annealing temperature that accomplishes the above-described lattice structure alignment is at or above about 300° C. During the annealing process, the bottom MTJ free layer (containing, for example, CoFeB) and the interfacial reference layer will crystallize from the bcc (001) MgO interface and establish the same bcc (001) texture of the MgO tunnel barrier within the free layer and the interfacial reference layer.

The PMA layer, which is part of the MTJ reference layer, is formed and/or deposited on the interfacial reference layer after the in-situ alignment and the in-situ annealing. Formation of the PMA layer is preferably at a temperature that is not sufficient to cause epitaxial crystal growth between the PMA reference layer lattice structure and the interfacial reference layer lattice structure. Formation of the PMA layer is preferably at a temperature that is also not sufficient to cause element diffusion from the PMA layer. In one or more embodiments, the post-PMA-formation temperature is below about 400° C. Thus, the disclosed in-situ lattice alignment and in-situ annealing operation generate uniform crystal lattice structures that extend through the tunnel barrier, the free layer and the interfacial reference layer. This provides a relatively high TMR, particularly in comparison to the effect of a crystallized tunnel barrier acting alone, or in comparison to using a post-fabrication annealing operation to extend the tunnel barrier crystallization into interfacing layers.

Examples of suitable MTJ layer materials include the free layer formed from Fe, CoFe, CoFeB or bi-layers of the above. The free layer could also be L10 alloys, L12 alloys, and multi-layers of Co, Ni, Pt and Pd, coupled to a CoFeB containing layer. A suitable thickness of the free layer may be in the range from about 8 Å to about 50 Å. The MTJ interfacial reference layer could be formed from Fe, CoFe, CoFeB or bi-layers of the above, with thickness in the range from about 5 Å to about 30 Å. The PMA reference layer could be any material with PMA, including CoCrPt alloys, TM-RE alloys, L10 alloys, L12 alloys, and multi-layers of Co, Ni, Pt and Pd, with thickness in the range from about 10 Å to about 300 Å.

Turning now to an overview of the present disclosure, FIG. 1A depicts a conceptual diagram illustrating at a high level the disclosed methodology for fabricating an MTJ memory cell using an in-situ lattice alignment operation 240 that results in a relatively high TMR in accordance with one or more embodiments. FIG. 1A shows two states of an in-situ layer stack 220 formed from an interfacial reference layer 210, a tunnel barrier 208 and a free layer, configured and arranged as shown. FIG. 1A illustrates three basic stages, namely, a pre-in-situ-alignment, a creation of the in-situ lattice alignment (240) and a post-in-situ-alignment. All three stages occur prior to formation and/or deposition of any PMA layers. Under pre-in-situ-alignment, interfacial reference layer 210 is amorphous, tunnel barrier 208 is crystalline and free layer 206 is amorphous. Here, crystalline tunnel barrier 208 influences TMR, and amorphous free layer 206 and interfacial reference layer 210 do not influence TMR. Thus, the contribution of crystalline tunnel barrier 208 to TMR may be described as equal to a value, designated "X," and this is shown graphically in FIG. 1A by the notation TMR="X."

In-situ lattice alignment 240 is applied to in-situ layer stack 220, which is preferably accomplished by an in-situ annealing operation applied to in-situ stack 220 prior to any formation and/or deposition of a PMA layer (not shown). This results in the third stage, namely, the post-in-situ-alignment. Under post-in-situ-alignment, interfacial reference layer 210 is now crystalline, tunnel barrier 208 is crystalline and free layer 206 is now crystalline. More specifically, the crystalline lattice structures grown into free layer 206 and interfacial reference layer 210 from crystalline tunnel barrier 208 are aligned with the crystalline lattice structure of tunnel barrier 208. Here, all three crystalline layers, tunnel barrier 208, interfacial reference layer 210 and free layer 206 influence TMR. Thus, the contribution of crystalline tunnel barrier 208, interfacial reference layer 210 and free layer 206 to TMR may be described as greater than the value, designated "X," which was the TMR contribution generated by the crystalline tunnel barrier 208 acting alone. This enhanced TMR is shown graphically in FIG. 1A by the notation TMR>"X."

Figure 1B:
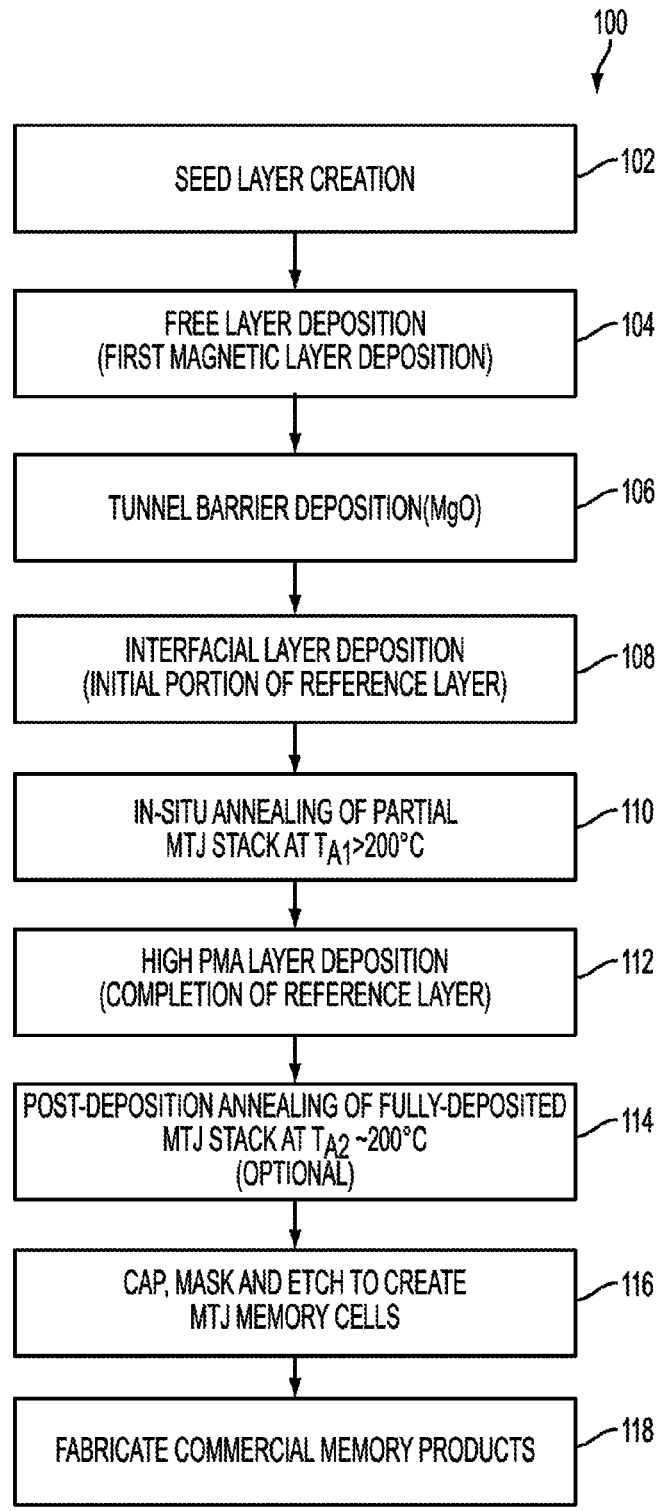
FIG. 1B depicts a flow diagram illustrating a methodology for fabricating an MTJ memory cell having in-situ annealed layers and high TMR in accordance with one or more embodiments.
Figure 2A:
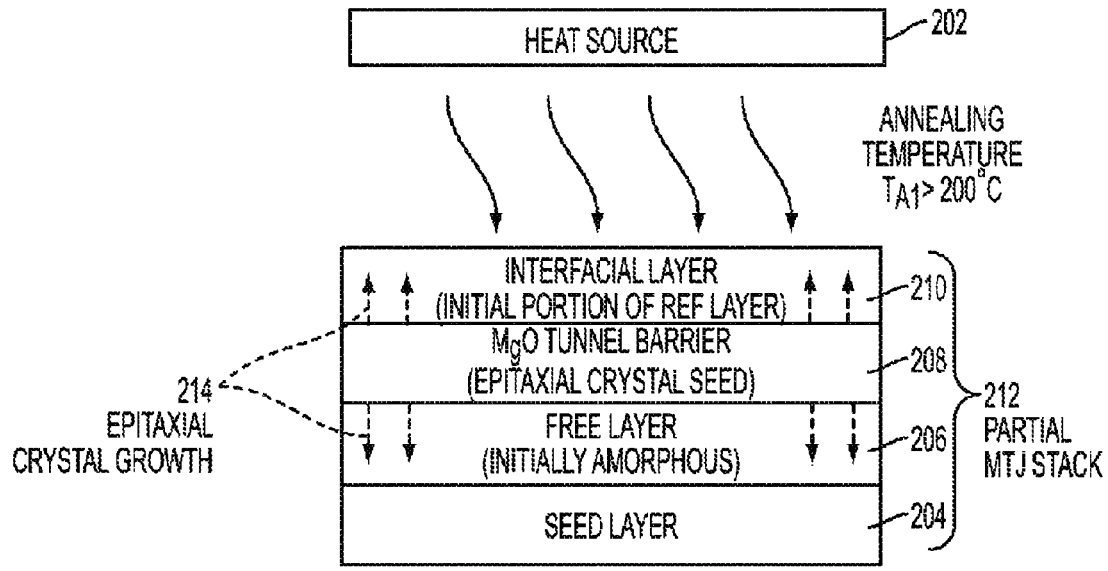
FIGS. 2A-2C depict a conceptual illustration of an in-situ annealed MTJ memory cell during various stages of the fabrication methodology shown in FIG. 1B.
Figure 2B:
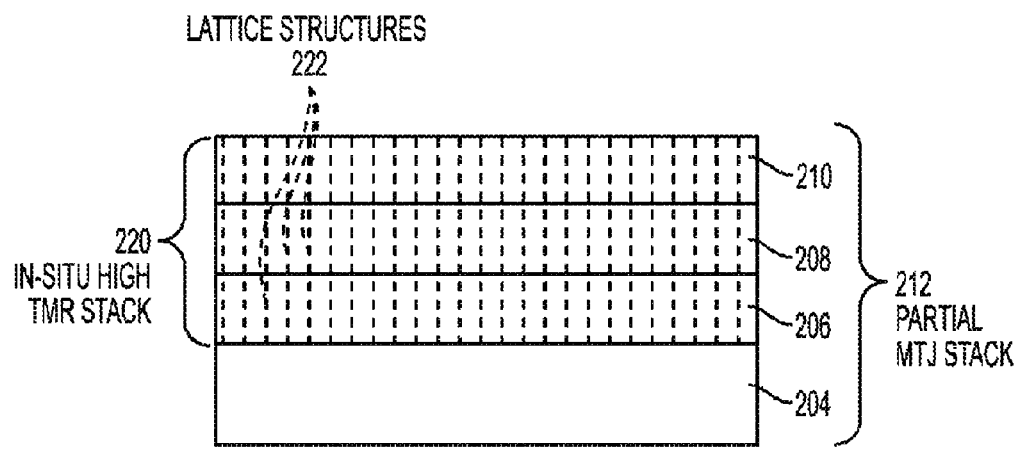
Figure 2C:
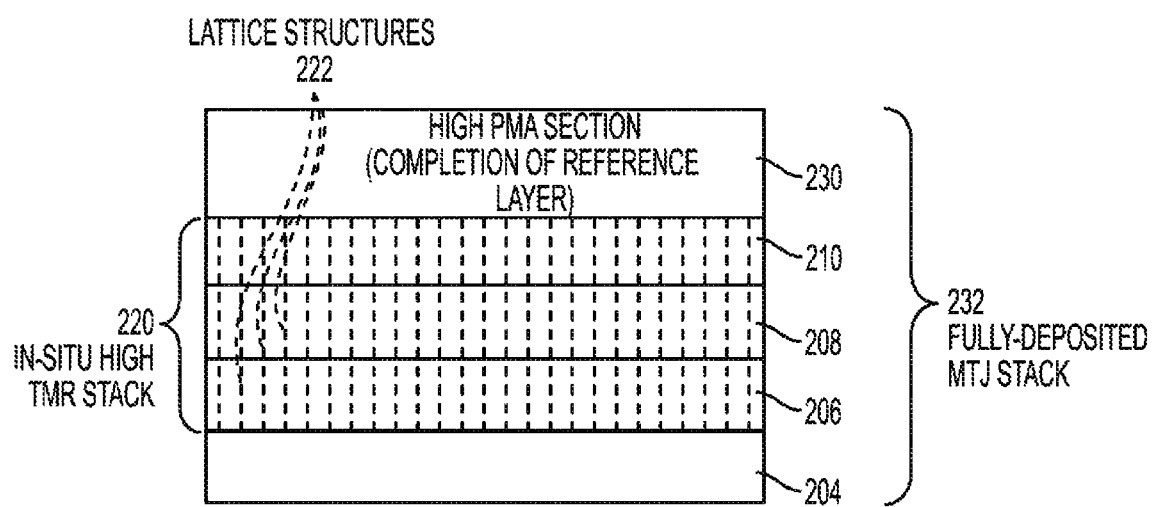
Figure 6:
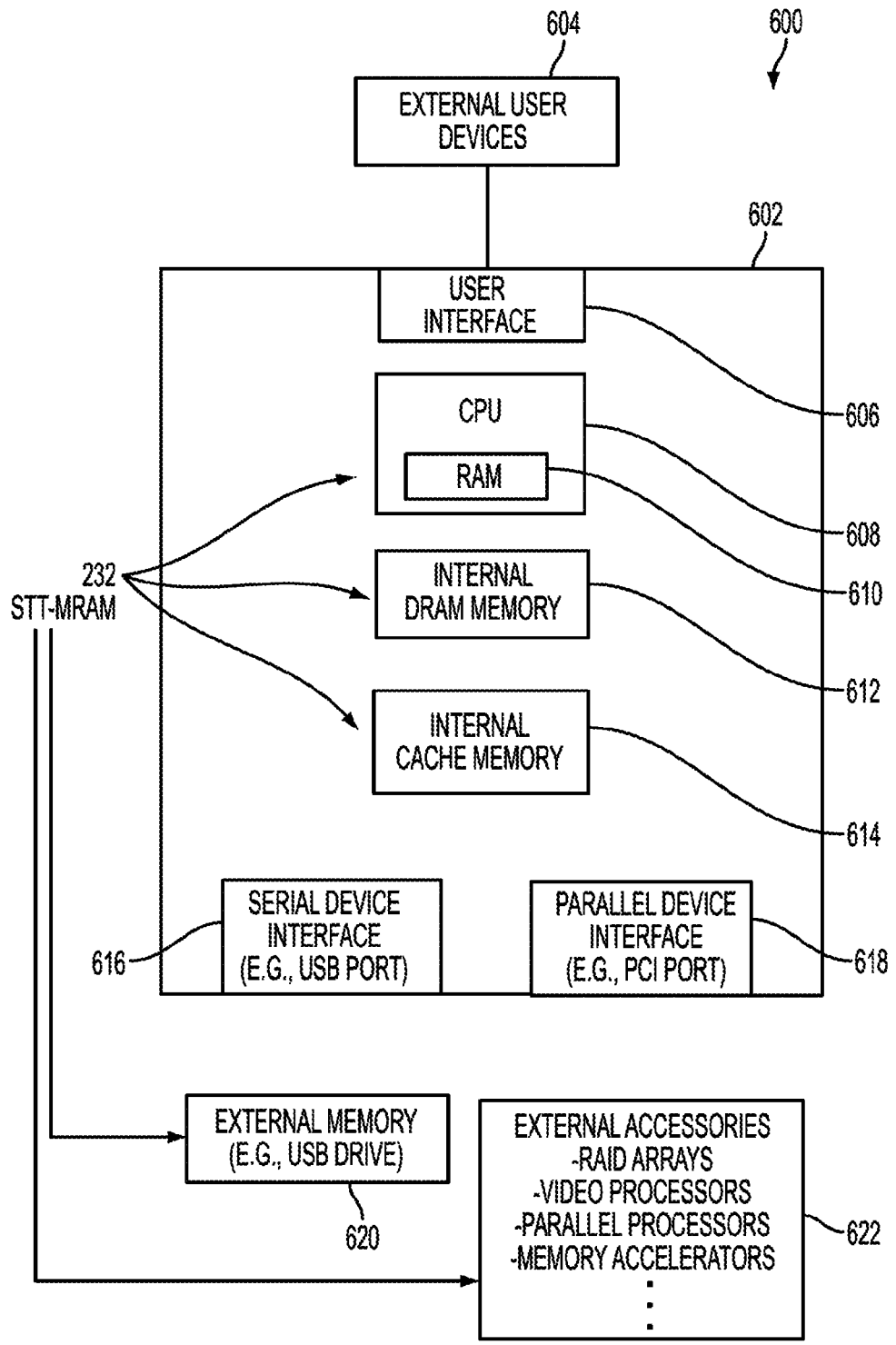
FIG. 6 depicts a conceptual diagram of a computer system having one or more STT-MRAM devices having in-situ aligned MTJ memory cells in accordance with one or more embodiments.

FIG. 1B is a logic flow diagram illustrating a process 100 for creating STT-MRAM products with in-situ lattice alignments in accordance with one or more embodiments of the present disclosure, which is described below with further reference to FIGS. 2A, 2B, 2C and 6. FIGS. 2A and 2B are conceptual illustrations of the in-situ alignment process, and FIG. 2C illustrates the post-fabrication annealing process. FIG. 6 is a conceptual diagram of a computer system capable of utilizing one or more STT-MRAM memory arrays incorporating the disclosed in-situ lattice aligned MTJ memory cells.

Referring now to FIG. 1B with further reference to FIGS. 2A and 2B, in block 102 a seed layer 204 having a desired crystalline structure is created, for example by polishing the upper surface a silicon crystal substrate that has been doped to create select transistors at locations where MTJ memory cells are to be created. Block 102 is followed by block 104, in which free layer 206 is deposited on seed layer 204. Free layer 206 may include be formed from Fe, CoFe, CoFeB or bi-layers of the above. Free layer 206 may also or alternatively include L10 alloys (e.g., FeAu), L12 alloys (e.g., $Cu_3Au$), and multi-layers of Co, Ni, Pt and Pd, coupled to a CoFeB containing layer. The thickness of free layer 206 may be in the range from about 8 Å to about 50 Å.

Block 104 is followed by block 106, in which MgO tunnel barrier layer 208 is deposited on free layer 206. MgO tunnel barrier 208 may be grown on various materials which do not diffuse significantly under 500° C., such as Ta, TaN, Mo, MoN, W, MgO or other oxides. Block 106 is followed by block 108, in which interfacial reference layer 210 is deposited on MgO tunnel barrier layer 208. Interfacial reference layer 210 may be formed from cobalt-iron (CoFe), cobalt-iron-boron (CoFeB), or a similar ferromagnetic material. The creation of in-situ lattice alignment between tunnel barrier 208, free layer 206 and interfacial reference layer 210, is accomplished at block 110, wherein tunnel barrier 208, free layer 206 and interfacial reference layer 210 are annealed with a heat source 202 applied through interfacial reference layer 210. In-situ annealing raises a temperature of the interfaces between MgO tunnel barrier layer 208, interfacial reference layer 210 and free layer 206 to a relatively high temperature at or above about 300° C. (e.g., ~350° C.) to create in-situ high TMR stack 220. Epitaxial crystal growth 214 (shown in FIG. 2A) extends from MgO tunnel barrier 206 into free layer 206 and interfacial reference layer 210 until the aligned lattice structure 222 (shown in FIG. 2B) is created within in-situ high TMR stack 220.

Referring to FIG. 1B, with further reference to FIG. 2C, after cooling block 110 is followed by block 112, in which a heavily PMA reference layer 230 is deposited above interfacial reference layer 210. PMA layer 230 may be deposited at room temperature or a heated temperature lower than the in-situ annealing temperature to avoid re-crystallizing in-situ high TMR stack 220 into other textures, which would degrade the high TMR interface and reintroduce the potential for element diffusion through in-situ high TMR stack 220.

Figure 4:
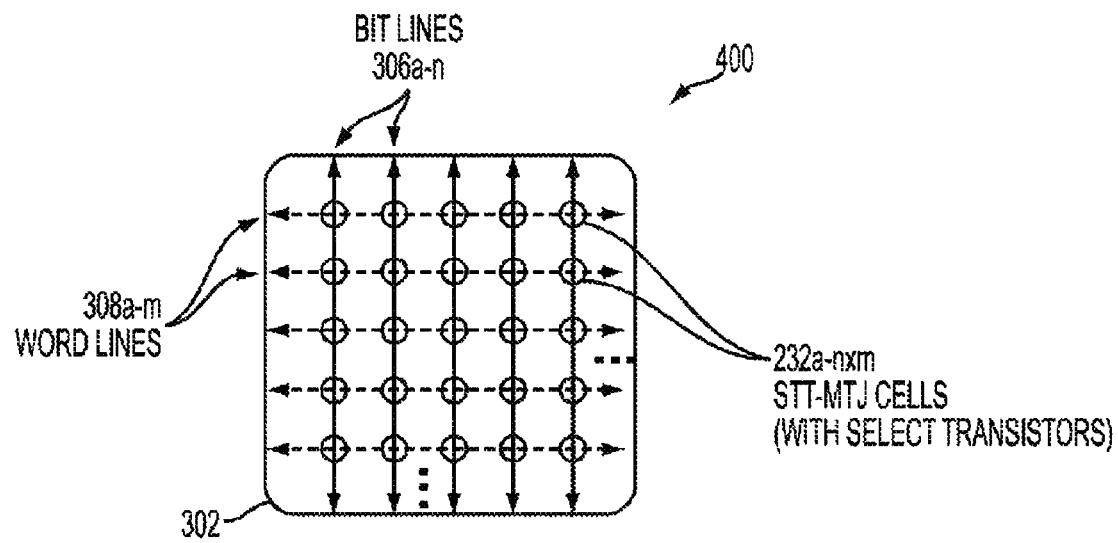
FIG. 4 depicts a conceptual illustration of an STT-MRAM array having in-situ aligned MTJ memory cells in accordance with one or more embodiments.
Figure 5:
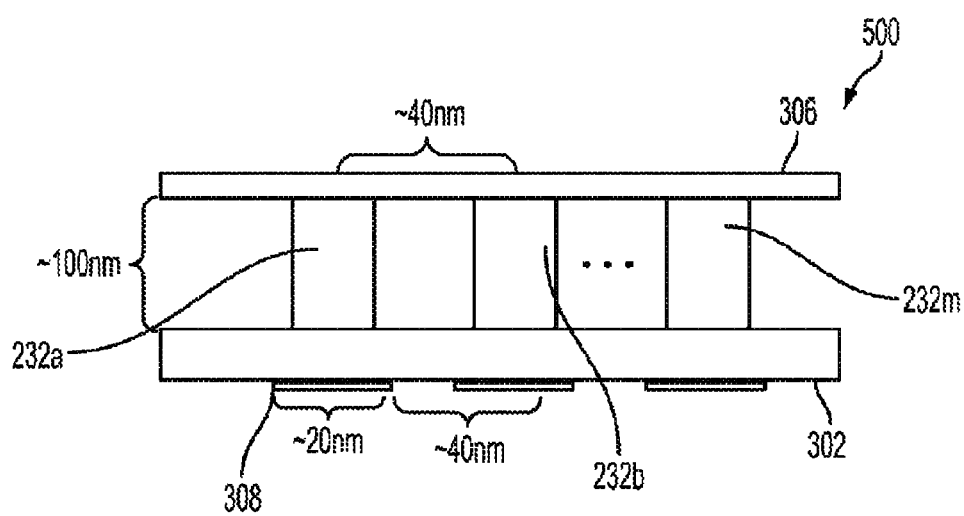
FIG. 5 depicts a conceptual illustration showing example cell spacing within of an STT-MRAM array having in-situ aligned MTJ memory cells in accordance with one or more embodiments.

At block 114, a post-deposition annealing is performed. Preferably, the post-deposition annealing temperature is lower than the in-situ annealing temperature to prevent re-crystallization of the in-situ high TMR stack 220, as described above. At block 116 MTJ stack 232 is masked with a conductive layer (typically the bit line layer 306 shown in FIGS. 3A and 3B) and etched to form an array of MTJ memory cells (as shown in FIGS. 4 and 5). It should be noted that alternatives and options may be employed, such as for example the single-crystal nature of the MTJ film stack could be terminated earlier (e.g., after the tunnel barrier). As another alternative, the order of the free and reference layers could be reversed such that the free layer is on top. Similarly, MTJ patterning methods other than a conductive hard mask may be utilized. In addition, a wide variety of supplemental manufacturing process may be applied to embody the STT-MRAM arrays into processors, memory chips, memory boards, accessories, and other commercial products.

Referring to FIG. 1B with further reference to FIG. 6, a computer system 600 serves as an illustrative product incorporating one or more STT-MRAM memory arrays 232. To provide a few examples of STT-MRAM memory in illustrative computer products, the computer system 600 may be any type of desktop, laptop, mobile, or special purpose computing system. In this example, the computer system 600 includes a host platform 602 connected to a number of external user devices 604, such as a touch screen, keyboard, mouse, microphone and the like. The host platform includes a user interface 606 supporting the externals user devices 604 as well as a CPU 608 that includes a relatively small allocation of on-chip random access memory (RAM) 610. The host platform may also include a relatively large supply of internal dynamic random access memory (DRAM) 612 and an intermediate sized allocation of internal cache memory 614. The host platform may also include a serial device interface 616 (e.g., USB port) and a parallel device interface 618. While these ports are general purpose, for the purpose of illustrating embodiments of STT-MRAM they may be used to connect various types of memory and appliances using memory to the host platform. For example, a USB memory drive 620 may be connected the USB port 616 and data-intensive accessories 622, such as a RAID arrays, video processors, parallel processors, memory accelerators, cloud storage, and myriad other accessories and systems may be connected to the parallel port 618.

Generally, STT-MRAM has the characteristics of being non-volatile (because the magnetic moment of the free layer is persistent after power is removed), extremely fast (because electric micro-currents are used to read and write bits), and very compact (on the order of tens of nanometers per memory cell). As the technology develops, the cost will be relatively expensive at first and then come down as manufacturing capacity develops and the technology matures.

Given these factors, the STT-MRAM 232 is expected to be adopted early for on-chip RAM 610, where the fast nature of the memory will be highly leveraged, the small nature of the cells will increase the amount of RAM available from a limited allocation chip space, and the non-volatile nature of the memory will represent a paradigm shift from the historical state of the art where only volatile on-chip RAM is presently available.

Another highly valued application for the STT-MRAM 232 will be the internal cache memory 614, where the high-speed, non-volatile and compact nature of the technology will greatly enhance the capacity and performance of the cache memory. Similarly, the data-intensive external accessories 622, such as video processors, parallel processors, memory accelerators and the like are also expected to be early adopters of STT-MRAM technology. As costs come down, STT-MRAM may ultimately find application in the DRAM boards 612, USB flash drives 620 and other memory devices where cost may be a more determinative factor.

Figure 3A:
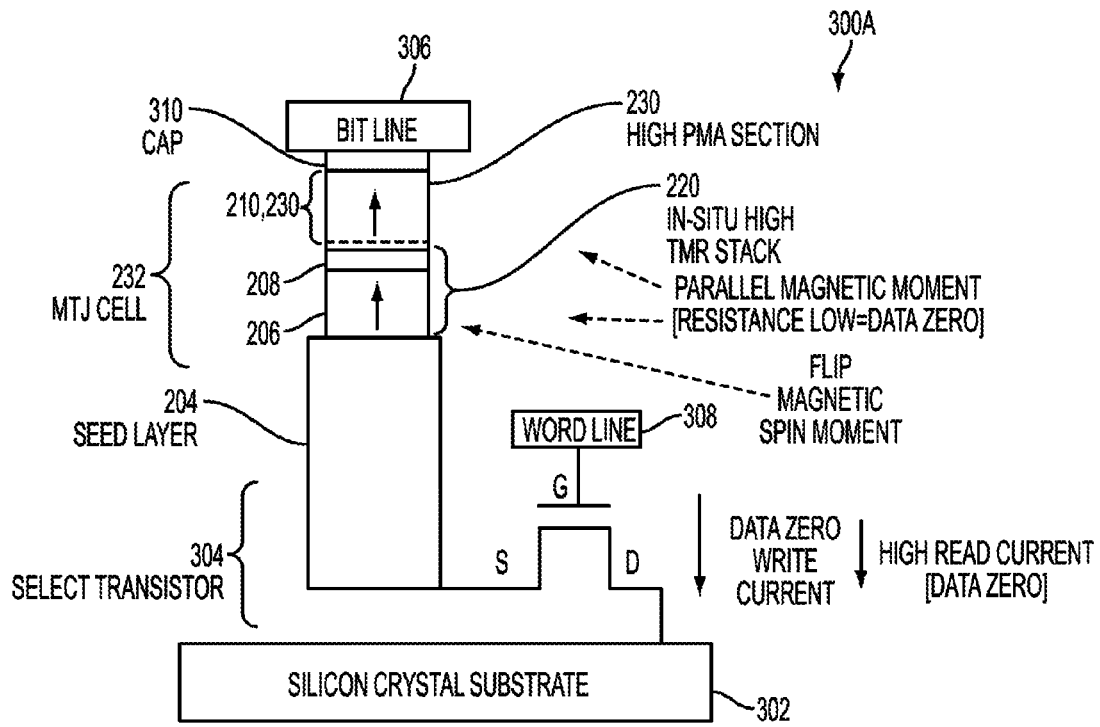
FIG. 3A depicts a conceptual illustration of an in-situ annealed MTJ memory cell in a "data zero" state in accordance with one or more embodiments.

With reference now to FIG. 3A, a conceptual illustration of an STT-MRAM structure 300A is depicted with an in-situ lattice aligned MTJ memory cell 232 fabricated in accordance with the present disclosure located on top of a silicon crystal substrate 302. The memory cell 232 is deployed electrically between a conductive bit line 306 and a conductive word line 308 utilized for selecting and conducting write and read currents through the memory cell. The MTJ cell 232 is integrated with a select transistor 304 defined by conventional semiconductor doping within the silicon crystal substrate 302. The MTJ memory cell 232 is electrically connected in series between the bit line and the source-drain current path of the select transistor 304. While the MTJ stack may be grown directly on top of the uniform crystal substrate 302, the select transistor 304 is shown schematically in FIG. 3A above the substrate 302 for illustrative convenience.

In this particular configuration, the MTJ cell 232 is connected to the source (S) of the select transistor 304 with the drain (D) connected to the substrate 302 to enable the select transistor to selectively drive electric micro-currents through the MTJ stack. While the MTJ cell 232 in this example is connected to the source, it may equivalently be connected on the drain side of the select transistor. The gate (G) of the select transistor 304 is connected to the word line 308 enabling the word line to bias the gate of the select transistor to enable current flow through the memory cell 232. The word line 308 shown schematically in FIGS. 3A and 3B may be located on a plane under the substrate, embedded within the substrate, or in the case of vertical select transistors embedded within the substrate around the gate portions of the select transistors located vertically between the source and drain portions of the transistor.

The MTJ memory cell 232 includes a stack of layers including a PMA reference layer 210, 230 with a fixed magnetic moment (shown by an upward arrow), an MgO tunnel barrier layer 208 configured to enable electrons to tunnel through the tunnel barrier layer, and a free layer 206 configured with an adaptable magnetic moment (shown by an upward arrow) for storage of data. STT-MRAM technology utilizes electric micro-currents conducted through the MTJ cell to write data to alter (flip) the adaptable magnetic moment of the free layer, which causes the MTJ stack to exhibit different resistance levels corresponding to the different data one states. The crystal structure of the MTJ stack may be fully or partially self-aligned with a seed layer trough hetero-epitaxial crystal growth from the seed layer. In the embodiments described in this disclosure, the seed layer is an epitaxial interface 204 (exaggerated for illustrative convenience) that is directly or indirectly aligned with the upper surface of the silicon crystal substrate 302. In accordance with the present disclosure, in-situ high TMR stack 220 is in-situ annealed at a higher temperature than the post-deposition annealing temperature to prevent re-crystallization of the in-situ annealed MTJ layers.

Figure 3B:
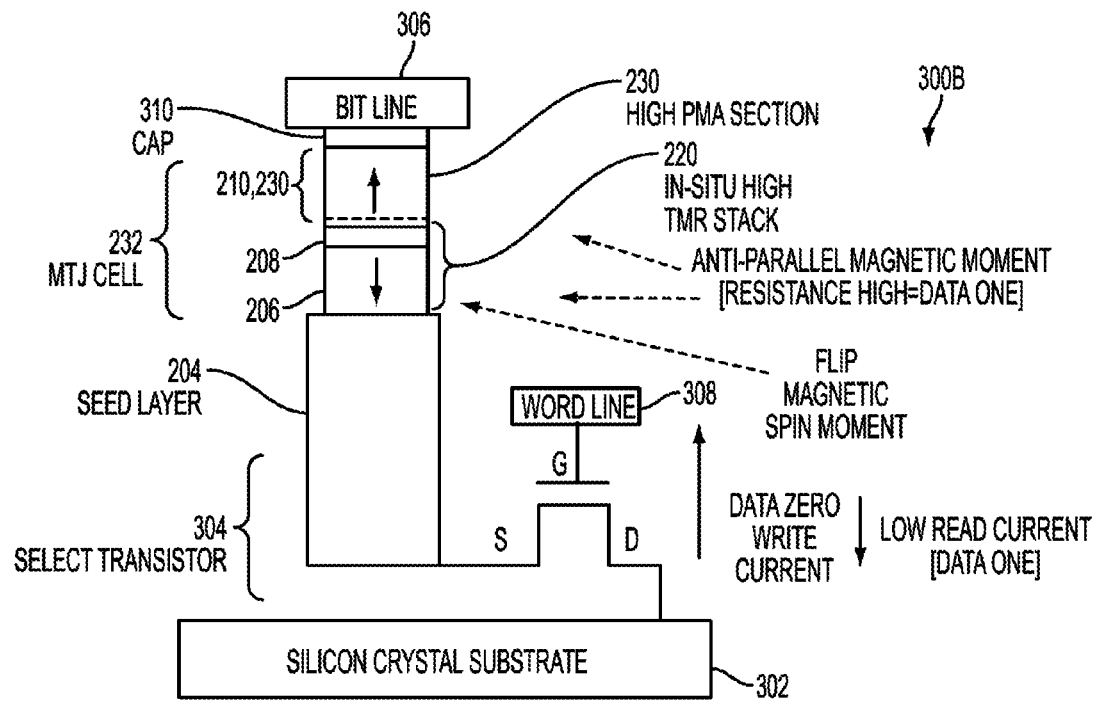
FIG. 3B depicts a conceptual illustration of an in-situ annealed MTJ memory cell in a "data one" state in accordance with one or more embodiments.

FIG. 3A shows the MTJ cell 300A in a "data zero" state while FIG. 3B shows the cell 300B in a "data one" state. Generally, the reference layer 210, 230 acts as a "spin filter" for reversibly aligning the magnetic spin of electrons in ferromagnetic molecules in the free layer 206 by passing a sufficient electric micro-current through the reference and free layers to impose the magnetic spin alignment of the reference layer onto the free layer. By convention, the "data zero" state is established by supplying an enabling voltage to the gate (G) of the select transistor 304 through the word line 308 while conducting sufficient write current in the source-to-drain direction of the select transistor (which by convention corresponds to electrons flowing in the drain-to-source direction). This aligns the spin moment of the free layer 206 into the same direction as the spin moment of the reference layer 210, 230 (i.e., parallel spin moment alignment).

Alignment of the spin moments places the MTJ cell into the "data zero" state where the parallel electron spin alignment of the reference layer and the free layer produces a relatively low resistance through the MTJ cell 232, which by convention is designated as the "data zero" state. This data state persists until another sufficiently high write current in the reverse direction is conducted through the cell. Once the spin state of the reference layer has been set to the "data zero" state shown in FIG. 3A, the data bit may be read by supplying an enabling voltage to the gate (G) of the select transistor 304 through the word line 308 while conducting a "read current" in the source-to-drain direction sufficient to read the data bit without flipping the magnetic spin alignment of the free layer 206.

FIG. 3B shows the STT-MRAM cell 300B in the "data one" state. The data state is flipped from the "data zero" state shown in FIG. 3A to the "data one" state shown in FIG. 3B by supplying an enabling voltage to the gate (G) of the select transistor 304 through the word line 308 while supplying a sufficient write current in the drain-to-source direction to flip the spin moment alignment of the free layer 206 from parallel with the reference layer (as shown in FIG. 3A) to anti-parallel (as shown in FIG. 3B). This increases the resistance though the MTJ cell 232 so that a subsequent read operation will produce a lower read current ("data one") than the read operation registers when the MTJ cell is in the parallel ("data zero") state shown in FIG. 3A. The same read data operation therefore produces a higher read current when the MTJ cell is on the "data zero" state (FIG. 3A) than when the MTJ cell is on the "data one" state (FIG. 3B) allowing the data state of the MTJ cell to be determined from the magnitude of the read current drawn during the read operation.

The reference layer 210, 230 includes ferromagnetic elements that hold the magnetic spin orientation during operation of the MTJ memory cell, while the tunnel barrier layer 208 contains elements with low spin polarization. Minimizing diffusion of elements with low spin polarization from the MgO layer into the PMA layer maintains the purity of the PMA reference layer. Similarly, minimizing diffusion of elements with high spin polarization from the PMA layer into the MgO layer maintains the purity of the MgO tunnel barrier layer. This improves the consistency of the magnetic performance of the PMA layer, maintains high TMR through the tunnel barrier, and facilitates reductions in MTJ size, thickness and power requirements.

FIG. 4 is a conceptual illustration of an STT-MRAM array 400 in accordance with an embodiment of the present disclosure. In one configuration, bit lines 306a-n run in one direction across the array usually on top of the MTJ memory cells, while word lines 308a-m run in an orthogonal direction across the array usually below the MTJ memory cells. This allows an array of MTJ memory cells 232a-n×m to be located that the junctions of the bit lines and word lines. The word lines 308a-m are usually connected to the gates (G) of the select transistors while the bit lines 306a-n are connected in series with the source-drain connection of the select transistors. As a result, an individual MTJ cell may be selected for read and write operations by supplying the proper voltage to that cell's corresponding bit line and word line.

FIG. 5 is a conceptual illustration of a hetero-epitaxial MTJ layer arrangement 500 for MTJ cells in accordance with an embodiment of the present disclosure. As discussed previously, embodiments of the present disclosure are directed to including an in-situ lattice alignment between the reference layer and the tunnel barrier layer and the interfacial reference layer of the MTJ cell, which improves layer isolation thereby reducing layer thicknesses as well as the cell spacing between MTJ cells. To provide a scale of magnitude context for this technology, in an example arrangement shown in FIG. 5 each MTJ cell may be in the range of about 20 nm wide with about 20 nm spacing between cells producing a cell-to-cell spacing interval of about 40 nm. This roughly corresponds to a substrate size of 400 mm by 400 mm accommodating an array of a million ($10^6$) by a million ($10^6$) MTJ memory cells, which is 1,000 billion (one trillion) MTJ cells in total on the 400 mm square substrate area. This general order of magnitude of memory cell density would allow, for example, a single 400 mm square silicon crystal substrate to be divided into 1,000 memory chips (i.e., an array of 100 by 100 chips on the 400 mm square substrate), where each chip contains a billion ($10^9$) MTJ memory cells.

Thus it can be seen from the foregoing detailed description that the present disclosure provides magnetic tunnel junction (MTJ) memory cells having in-situ lattice aligned layers. Preferably, the in-situ lattice alignment is accomplished by the disclosed in-situ annealing operation that crystallizes selected layers of the MTJ resulting in a large TMR. As used in the present disclosure, the term "in-situ lattice alignment" means a lattice alignment that is confined to selected layers of the MTJ. Similarly, as used in the present disclosure, the term "in-situ annealing" means an annealing that is confined to selected layers of the MTJ. By providing a large TMR, the disclosed embodiments allow electrons to more easily tunnel from one ferromagnetic layer (e.g., an MTJ free layer) through the thin dielectric tunnel barrier into the other ferromagnetic layer (e.g., an MTJ fixed layer). Thus, the large TMR results in a larger difference between the MTJ free layer resistance and the MTJ fixed layer resistance, and this improves the ability to read the MTJ state (e.g., a "0" or a "1").

Because, the disclosed in-situ lattice alignment occurs after the formation or deposition of the MgO tunnel barrier and the interfacial reference layer, but before the formation or deposition of the high PMA reference layer, the high PMA reference layer does not interfere with the crystallization of the interfacial reference layer or the free layer. Because the present disclosure does not allow the PMA reference layer to interfere with the in-situ lattice alignment, the PMA reference layer may now be provided with a high PMA, which is beneficial. Additionally, the lack of PMA interference with the crystallization of the interfacial reference layer, improves the likelihood that there will be only highly spin polarized material in the interfacial reference layer at the interface between the interfacial reference layer and the tunnel barrier layer. The high PMA reference layer is formed or deposited on top of the interfacial reference layer at a lower temperature or at room temperature after the in-situ lattice alignment operation. This significantly opens up the material choices for PMA MTJs. For example, using the present disclosure, easily grown PMA materials that are most suitable for MTJ applications may be chosen. Such easily grown PMA materials typically have either hcp crystal structure (for example CoCrPt) or fcc crystal structure (for example, Co/Pd, Co/Ni, Co/Pt multi-layers and CoPt L12 alloys).

Thus, the disclosed in-situ lattice alignment that is created via the disclosed in-situ annealing provides uniform crystal lattice structures that extend through the tunnel barrier, the free layer and the interfacial reference layer, thereby proving a relatively high TMR, particularly in comparison to the effect of a crystallized tunnel barrier acting along, or in comparison to using a post-deposition annealing operation to extend the tunnel barrier crystallization into interfacing layers.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A method of fabricating a magnetic tunnel junction (MTJ) memory cell, the method comprising:
   forming a free layer from an amorphous material;
   forming a tunnel barrier;
   forming a reference layer comprising an interfacial reference layer formed from another amorphous material;
   positioning the tunnel barrier between the interfacial reference layer and the free layer and further configuring the tunnel barrier to enable electrons to tunnel through the tunnel barrier between the interfacial reference layer and the free layer;
   performing a first in-situ alignment between a tunnel barrier lattice structure of the tunnel barrier and an interfacial reference layer lattice structure of the interfacial reference layer, wherein the first in-situ alignment results from an in-situ annealing operation applied prior to forming the PMA reference layer;
   performing a second in-situ alignment between the tunnel barrier lattice structure and a free layer lattice structure of the free layer, wherein the second in-situ alignment results from the in-situ annealing operation applied prior to forming the PMA reference layer;
   subsequent to performing the first in-situ alignment and the second in-situ alignment, forming a perpendicular magnetic anisotropy (PMA) reference layer, wherein the reference layer comprises the PMA reference layer and the interfacial reference layer; and
   applying a post-PMA-formation annealing operation to the MTJ memory cell after forming the PMA reference layer, wherein the in-situ annealing operation is performed at an in-situ annealing temperature that is higher than a post-PMA-formation annealing temperature of the post-PMA-formation annealing operation.

2. The method of claim 1, wherein a PMA reference layer lattice structure of the PMA reference layer is not aligned with the interfacial reference layer lattice structure.

3. The method of claim 1, wherein the in-situ annealing operation is applied prior to a finalization of the fabrication of the MTJ memory cell.

4. The method of claim 1, wherein the in-situ annealing temperature is sufficient to cause epitaxial crystal growth between the tunnel barrier lattice structure and the interfacial reference layer lattice structure.

5. The method of claim 4, wherein the in-situ annealing temperature is further sufficient to cause epitaxial crystal growth between the tunnel barrier lattice structure and the free layer lattice structure.

6. The method of claim 5, wherein the post-PMA-formation annealing temperature is not sufficient to cause epitaxial crystal growth between the PMA reference layer lattice structure and the interfacial reference layer lattice structure.

7. A method of fabricating a magnetic tunnel junction (MTJ) memory cell, the method comprising:
   forming a reference layer from a perpendicular magnetic anisotropy (PMA) reference layer and an interfacial reference layer;
   forming a free layer;

forming a tunnel barrier, wherein the tunnel barrier comprises a face-centered-cubic (fcc) structure;
positioning the tunnel barrier between the interfacial reference layer and the free layer;
configuring the tunnel barrier to enable electrons to tunnel through the tunnel barrier between the interfacial reference layer and the free layer;
providing a first in-situ alignment between a tunnel barrier lattice structure of the tunnel barrier and an interfacial reference layer lattice structure of the interfacial reference layer, wherein the first in-situ alignment results from an in-situ annealing operation applied prior to a formation of the PMA reference layer; and
providing a second in-situ alignment between the tunnel barrier lattice structure of the tunnel barrier and a free layer lattice structure of the free layer, wherein the second in-situ alignment results from the in-situ annealing operation applied prior to the formation of the PMA reference layer;
wherein the PMA reference layer lattice structure is not aligned with the interfacial reference layer lattice structure;
wherein a post-PMA-formation annealing operation is applied to the MTJ memory cell after a formation of the PMA reference layer;
wherein the in-situ annealing operation is performed at an in-situ annealing temperature that is higher than a post-PMA-formation annealing temperature of the post-PMA-formation annealing operation.

8. The method of claim 7, wherein the in-situ annealing operation is applied prior to a finalization of the fabrication of the MTJ memory cell.

9. The method of claim 7, wherein:
the in-situ annealing temperature is sufficient to cause epitaxial crystal growth between the tunnel barrier lattice structure and the interfacial reference layer lattice structure; and
the in-situ annealing temperature is further sufficient to cause epitaxial crystal growth between the tunnel barrier lattice structure and free layer lattice structure.

10. The method of claim 7, wherein the in-situ annealing temperature is greater than or equal to 300° C.

11. The method of claim 7, wherein the post-PMA-formation annealing temperature is not sufficient to cause epitaxial crystal growth between the PMA reference layer lattice structure and the interfacial reference layer lattice structure.

12. The method of claim 11, wherein the post-PMA-formation annealing temperature is below 400° C.

13. The method of claim 7, wherein:
the tunnel barrier comprises magnesium oxide (MgO) having a face-centered-cubic (fcc) structure;
the interfacial reference layer comprises cobalt-iron (CoFe) or cobalt-iron-boron (CoFeB);
the free layer comprises cobalt-iron (CoFe) or cobalt-iron-boron (CoFeB); and
the PMA reference layer comprises a hexagonal-close-packed (hcp) structure or a face-centered-cubic (fcc) structure.

* * * * *